United States Patent [19]
Yatsuyanagi

[11] Patent Number: 5,362,604
[45] Date of Patent: Nov. 8, 1994

[54] PHOTOSENSITIVE RESIN COMPOSITION AND PROCESS FOR THE PRODUCTION THEREOF, AND VIRGIN FLEXOGRAPHIC PRINTING PLATE

[75] Inventor: Yoshimi Yatsuyanagi, Tokyo, Japan

[73] Assignee: Toyo Ink Manufacturing Co., Ltd., Tokyo, Japan

[21] Appl. No.: 977,000

[22] PCT Filed: Aug. 7, 1992

[86] PCT No.: PCT/JP92/01028
§ 371 Date: Feb. 2, 1993
§ 102(e) Date: Feb. 2, 1993

[87] PCT Pub. No.: WO93/03423
PCT Pub. Date: Feb. 18, 1993

[30] Foreign Application Priority Data

Aug. 9, 1991 [JP] Japan ............................ 3-224546

[51] Int. Cl.⁵ .................. G03F 7/027; G03F 7/038
[52] U.S. Cl. .................. 430/281; 430/284; 430/306; 525/77; 525/80; 525/82
[58] Field of Search ............ 525/80, 910, 77, 82; 430/281, 284, 306

[56] References Cited

U.S. PATENT DOCUMENTS 4,753,865  6/1988  Fryd et al. ................... 430/281

FOREIGN PATENT DOCUMENTS 0226380  5/1990  Japan .

Primary Examiner—Melvyn I. Marquis
Assistant Examiner—D. Aylward
Attorney, Agent, or Firm—Wenderoth, Lind & Ponack

[57] ABSTRACT

A photosensitive resin composition suitable for producing a virgin flexographic printing plate, a process for the production thereof and a virgin flexographic printing plate. The photosensitive resin composition comprises (1) a photosensitive microgel obtained by emulsion-polymerizing (a) a compound having an α, β-ethylenically unsaturated double bond in the presence, as an emulsifier, of (b) a compound containing a tertiary ammonium salt to prepare (A) fine microgel particles and reacting the (A) fine microgel particles with (B) a compound having an epoxy group to react with the tertiary ammonium salt and at least one α, β-ethylenically unsaturated double bond per molecule, (2) a compound having an α, β-ethylenically unsaturated double bond, and (3) a rubber or thermoplastic elastomer.

10 Claims, No Drawings

PHOTOSENSITIVE RESIN COMPOSITION AND PROCESS FOR THE PRODUCTION THEREOF, AND VIRGIN FLEXOGRAPHIC PRINTING PLATE

TECHNICAL FIELD

The present invention relates to a water-developable photosensitive resin composition. More specifically, it relates to a photosensitive resin composition having rubbery resilience and comprising a photosensitive microgel having an $\alpha, \beta$-ethylenically unsaturated double bond on each gel particle, a compound having an $\alpha, \beta$-ethylenically unsaturated double bond and either rubber or a thermoplastic elastomer, and a virgin flexographic printing plate formed therefrom.

TECHNICAL BACKGROUND

In recent years, flexography has been attracting attention with packing being modernized. However, a process for preparing a conventional flexographic printing plate requires at least three steps of (a) preparing a metal plate, (b) molding and (c) vulcanizing rubber. The defects with this process are therefore that it requires skilled workmanship and a long period of time and that the preparation requires a considerably high cost. As a material to overcome these defects, there have been developed printing plates of photosensitive resins developable with a solvent, and a flexographic printing plate can now be simply prepared. Since, however, these printing plates are formed of diene-containing rubbers such as polybutadiene as a base material, it is required to use halogen-containing solvents such as trichlene, perchlene, etc., as a developer in development. Nevertheless, these halogen-containing solvents tend to be limited in use due to an environmental problem and toxicity to human bodies. It has been therefore desired to develop a flexographic printing plate which can be developed with water, free of toxicity to a human body and which has resistance to a water-base ink used for flexography. However, the prior art has found it difficult to satisfy contradicting requirements, i.e., water-developability and resistance to water and alcohol. The present inventor has therefore made a study to apply a microgel obtained by the novel process for producing a photosensitive microgel (JP-A-02-263805), proposed by the present applicant, to a flexographic printing plate. However, it has been hardly possible to obtain a satisfactory one in terms of physical properties such as rubbery resilience.

Further, the present inventor has produced a thick printing plate for flexography by a method of:

(a) repeating casting → drying → casting, or (b) gradually drying a thick material around room temperature. However, the problem with these methods is that time and labor are extraordinarily required, and that other components and an initiator to be used are limited to water-base ones.

DISCLOSURE OF THE INVENTION

The present invention provides a photosensitive resin composition comprising (1) a photosensitive microgel obtained by emulsion-polymerizing (a) a compound having an $\alpha, \beta$-ethylenically unsaturated double bond in the presence, as an emulsifier, of (b) a compound containing a tertiary ammonium salt to prepare (A) fine microgel particles and reacting the (A) fine microgel particles with (B) a compound having an epoxy group to react with the tertiary ammonium salt and at least one $\alpha, \beta$-ethylenically unsaturated double bond per molecule, (2) a compound having an $\alpha, \beta$-ethylenically unsaturated double bond, and (3) a rubber or thermoplastic elastomer, a process for the production thereof, and a virgin flexographic printing plate produced therefrom.

The present inventor has made a diligent study to develop a photosensitive resin composition which not only has water-developability but also has properties required of a flexographic printing plate. The properties required of a flexographic printing plate include, for example, photosensitivity, resolution, developability, water resistance, isopropyl alcohol resistance, strength.elongation, low rubber hardness.high impact resilience, and the like. As a result, it has been found that the properties required of a flexographic printing plate such as water resistance.alcohol resistance, rubbery resilience, etc., can be satisfied when (2) a compound having at least one $\alpha, \beta$-ethylenically unsaturated double bond per molecule as a second component and (3) a rubber or thermoplastic elastomer as a third component are added to a photosensitive microgel having an $\alpha, \beta$-ethylenically unsaturated double bond on the surface, and the present invention has been arrived at. In particular, it has been found that the above properties are much more excellent when a urethane compound having at least one $\alpha, \beta$-ethylenically unsaturated double bond per molecule and/or any one of polydienes having $\alpha, \beta$-ethylenically unsaturated double bonds in their terminals or side chains (to be abbreviated as polydienes having carbon-carbon double bonds), or a mixture containing these compounds and other compound having an $\alpha, \beta$-ethylenically unsaturated double bond are/is used to form an interior portion (core) of the photosensitive microgel, and further when a urethane compound having at least one $\alpha, \beta$-ethylenically unsaturated double bond per molecule or polydiene(s) is used as a second component.

It has been also found that a sheet having a predetermined thickness can be produced quickly and simply, and the properties of a flexographic printing plate are remarkably improved, by drying the (1) photosensitive microgel and adding/mixing the (2) compound having an $\alpha, \beta$-ethylenically unsaturated double bond as a second component which shall not be limited to water base and (3) a rubber or thermoplastic elastomer to/with the dried photosensitive microgel and pressure-molding the resultant photosensitive resin composition.

It was thought in the beginning that when a finely milled microgel was once dried to be brought into a discontinuous film state, it was difficult to obtain a continuous film (sheet) by a later processing. However, the photosensitive microgel (1) could be fully formed into a sheet after dried even if it was used alone, and by adding the second and third components, a much tougher continuous film (sheet) could be obtained. It is considered that by adding the photosensitive second component (2) to the photosensitive microgel (1), this second component fills gaps of fine particles of the photosensitive microgel (1) make it possible to cure and crosslink the fine particles effectively, and that the strength and elongation can be remarkably improved by working the features of the third component.

The three-component system of (1), (2) and (3) improves the rubbery resilience and rubber hardness much more than the two-component system of (1) and (2). It is presumably because the above three-component system increases the crosslinking density much more than the two-component system of (1) and (3) that the water resistance and the strength improve. Further, the above three-component system improves the developability, the reason for which is not yet clear.

The (a) compound having an $\alpha, \beta$-ethylenically unsaturated double bond, used when the fine microgel particles (A) are synthesized, includes monofunctional compounds and polyfunctional monomers or oligomers having at least two $\alpha, \beta$-ethylenically unsaturated double bonds to form a three-dimensional crosslinking in the interior of each of the fine microgel particles (A). Examples of the monofunctional compounds include the following:

(1) As (meth)acrylic compounds, $C_1$–$C_{18}$ alkyl esters of (meth)acrylic acids such as methyl (meth)acrylate, ethyl (meth)acrylate, propyl (meth)acrylate, isopropyl (meth)acrylate, butyl (meth)acrylate, hexyl (meth)acrylate, octyl (meth)acrylate and lauryl (meth)acrylate; glycidyl (meth)acrylate; $C_2$–$C_8$ alkenyl esters of (meth)acrylic acids such as allyl (meth)acrylate; $C_2$–$C_8$ hydroxyalkyl esters of (meth)acrylic acids such as hydroxyethyl (meth)acrylate and hydroxypropyl (meth)acrylate; $C_3$–$C_{19}$ alkenyloxyalkyl esters of (meth)acrylic acids such as allyloxyethyl (meth)acrylate; and (meth)acrylic acid.

(2) As vinyl aromatic compounds, styrene, vinyl toluene and p-chlorostyrene.

(3) As others, acrylonitrile, methacrylonitrile, methyl isopropenyl ketone, vinyl acetate, vinyl propionate and vinyl pivalate.

Examples of the polyfunctional monomers or oligomers include the following:

(1) As (meth)acrylates, tri(meth)acrylic acid ester of trimethylolpropane, di(meth)acrylic acid esters of glycols, poly(meth)acrylic acid ester of polyol and di(meth)acrylic acid ester of polyester.

(2) As polyolefin compounds, butadiene, isoprene, chloroprene, divinylbenzene and diallyl phthalate.

(3) Oligomers having at least two polymerizable unsaturated double bonds.

The urethane compound having an $\alpha, \beta$-ethylenically unsaturated double bond can be produced from a diol compound, a diisocyanate compound and a compound having a hydroxyl group and an $\alpha, \beta$-ethylenically unsaturated double bond.

The diol compound includes a compound prepared by ring-opening polymerization of lactone, 4-membered lactone, 6-membered lactone, 7-membered lactone or a lactone having more members, such as $\beta$-propiolactone with or without a substituent, $\delta$-lactone with or without a substituent and $\epsilon$-lactone with or without a substituent in the presence or absence of a catalyst in the presence of ethylene glycol, etc., a compound prepared by condensing a glycol component and dibasic acid under conditions where an excess of the glycol component is present, such as polyethylene adipate, polypropylene adipate, polyethylene succinate and polyhexamethylene adipate, each of which is terminated with a hydroxyl group, polyethylene glycol, polypropylene glycol and polyepichlorohydrin.

The diisocyanate compound includes toluylene diisocyanate, diphenylmethane-4,4-diisocyanate, hexamethylene diisocyanate and isophorone diisocyanate.

The compound having a hydroxyl group and an $\alpha, \beta$-ethylenically unsaturated double bond includes hydroxylethyl (meth)acrylate, hydroxypropyl (meth)acrylate and allyl alcohol.

The polydiene having an $\alpha, \beta$-ethylenically unsaturated double bond can be obtained by reacting polybutadiene or polyisoprene having a terminal or branch formed of an epoxy group or an acid anhydride group with a compound having a functional group which reacts with these groups and an $\alpha, \beta$-ethylenically unsaturated double bond, e.g., $C_2$–$C_{20}$ hydroxyalkyl ester such as hydroxyethyl (meth)acrylate or hydroxypropyl (meth)acrylate, allyl alcohol or allylamine. It can be also obtained by reacting a hydroxyl group in the branch or terminal with an excess of diisocyanate groups and reacting the remaining isocyanate groups with hydroxyalkyl ester or allyl alcohol.

A selection is suitably made among the above compounds having an $\alpha, \beta$-ethylenically unsaturated double bond depending upon desired properties, and the above compounds may be used alone or in combination.

For satisfying a variety of resistances and properties required of a flexographic printing plate, it is preferred to three-dimensionally crosslink the interior portion (core) of each fine microgel particle (A). For this purpose, it is preferred to use at least one of compounds having at least two $\alpha, \beta$-ethylenically unsaturated double bonds, i.e., polyfunctional monomers, polyfunctional oligomers and polyfunctional prepolymers for forming the core.

The (b) compound containing a tertiary ammonium salt used for the emulsification of the (a) compound having an $\alpha, \beta$-ethylenically unsaturated double bond should have an effect as an emulsifier, and it is generally produced as a tertiary salt by neutralizing a compound having a tertiary amino group with an acid.

The above emulsifier includes emulsifiers having a low molecular weight and polymer emulsifiers. Examples of the emulsifiers having a low molecular weight include $C_6$–$C_{20}$ alkyl and alkenyl tertiary amines such as dimethyllaurylamine, dimethylmyristylamine, dimethylpalmitylamine, dimethylstearylamine, diethyllaurylamine, diethylmyristylamine, diethylpalmitylamine and diethylstearylamine, and reaction products obtained by reactions between tertiary amines of reactive monomers having an amino group such as 2,2-dimethylaminoethyl (meth)acrylate and 2,2-diethylaminoethyl (meth)acrylate and acids such as hydrochloric acid, nitric acid, sulfuric acid, acetic acid, propionic acid, butyric acid and (meth)acrylic acid.

Examples of the polymer emulsifiers include those products obtained by copolymerizing any one of reactive monomers having an amino group such as 2,2-dimethylaminoethyl (meth)acrylate and 2,2-diethylaminoethyl (meth)acrylate with other reactive monomer, and neutralizing the resultant polymers with an acid. The other monomer refers to at least one vinyl monomer selected from $C_1$–$C_{18}$ alkyl esters of (meth)acrylic acid such as methyl (meth)acrylate, ethyl (meth)acrylate, propyl (meth)acrylate, isopropyl (meth)acrylate, butyl (meth)acrylate, hexyl (meth)acrylate, octyl (meth)acrylate and lauryl (meth)acrylate: $C_2$–$C_8$ alkenyl esters such as allyl (meth)acrylate: $C_2$–$C_8$ hydroxyalkyl esters of (meth)acrylic acid such as hydroxyethyl (meth)acrylate and hydroxypropyl (meth)acrylate: $C_3$–$C_{19}$ alkenyloxyalkyl esters of (meth)acrylic acid such as allyloxyethyl (meth)acrylate: and (meth)acrylic acid.

Further, the above emulsifier also includes products obtained by neutralizing polymers containing an amino group, natural polymers such as xanthone and synthetic polymers such as polyethyleneimine, with an acid.

The above polymer emulsifier may be used directly, or after it is converted to a reactive emulsifier having an $\alpha,\beta$-ethylenically unsaturated double bond introduced by reacting part of its tertiary ammonium salt with a compound containing an epoxy group and $\alpha,\beta$-ethylenically unsaturated double bond such as glycidyl (meth)acrylate. Due to the above conversion to a reactive emulsifier, the emulsifier per se can be fixed in the interior portion (core) of each of the fine microgel particles (A) when the interior portion (core) is three-dimensionally crosslinked. Due to the fixation of the emulsifier (shell) in the interior portion (core) of each fine microgel particle (A), the flexographic printing plate can be improved in various resistance properties such as strength, elongation, hardness, water resistance and abrasion resistance.

The polymer emulsifier is used in an amount of 0.1 to 80% by weight, preferably 3 to 50% by weight, based on the (a) compound having an $\alpha,\beta$-ethylenically unsaturated double bond. When used in combination with the following surfactant having a low molecular weight, the polymer emulsifier is used in an amount of 0.1 to 50% by weight, preferably 3 to 20% by weight.

The surfactant having a low molecular weight, used in combination with the above polymer emulsifier, includes nonionic surfactants and cationic surfactants.

Examples of the nonionic surfactants include polyoxyethylene alkyl ethers such as polyoxyethylene lauryl ether, polyoxyethylene stearyl ether and polyoxyethylene cetyl ether, polyoxyethylene alkylallyl ethers such as polyoxyethylene octylphenyl ether and polyoxyethylene nonylpheny ether, polyoxyethylene derivatives, oxyethylene.oxypropylene block copolymers, sorbitan fatty acid esters such as sorbitan monolaurate, sorbitan monostearate and sorbitan trioleate, glycerin fatty acid esters and polyoxyethylene fatty acid esters.

Examples of the cationic surfactants include hydrochlorides of primary amines such as monomethylamine, monoethylamine and monostearylamine, hydrochlorides of secondary amines such as dimethylamine, diethylamine and distearylamine, hydrochlorides of tertiary amines such as trimethylamine, triethylamine and stearyldimethylamine, hydrochlorides of ethanolamines such as monoethanolamaine, diethanolamine and triethanolamine, hydrochlorides of polyethylenepolyamines such as ethylenediamine and diethylenetriamine, and hydrochlorides of amines such as pyridine, morpholine and hydrazine.

The above surfactant having a low molecular weight is used in an amount of 0.1 to 50% by weight, preferably 0.1 to 20% by weight, based on the (a) compound having an $\alpha,\beta$-ethylenically unsaturated double bond.

The temperature for the emulsion polymerization is between 50° and 95° C., preferably between 65° and 80° C. The emulsion polymerization is carried out under the conditions where the total solid content of the (a) compound having an $\alpha,\beta$-ethylenically unsaturated double bond and the emulsifier is 10 to 50% by weight, preferably 15 to 30% by weight. In the present invention, the microgel formed by the emulsion polymerization generally has a particle size of 0.02 to 20 $\mu$m when measured by a light scattering method.

The tertiary ammonium salt present on the so-formed fine microgel particles (A) is allowed to react with the (B) compound having an epoxy group and at least one $\alpha,\beta$-ethylenically unsaturated double bond per molecule to introduce the $\alpha,\beta$-ethylenically unsaturated double bond onto the fine microgel particle surface.

The (B) compound includes epoxy compounds having a polymerizable double bond such as glycidyl (meth)acrylate, N-glycidyl (meth)acrylamide, glycidyl allyl ether and 1,2-epoxy-5-hexene. The (B) compound is properly selected from the above compounds depending upon desired properties, and the above compounds may be used alone or in combination. The amount of the (B) compound is 1 to 100 mol % based on the amount of the tertiary ammonium salt on the fine microgel particle surface. The reaction is completed by only mixing an emulsion of the microgel with the (B) compound and stirring the mixture at a temperature between 30° and 90° C., preferably between 60° and 80° C., for about 2 hours.

The (2) compound having an $\alpha,\beta$-ethylenically unsaturated double bond is at least one member selected from monomers, oligomers and prepolymers. Examples thereof include those described regarding the (a) compound having an $\alpha,\beta$-ethylenically unsaturated double bond as a core material for the above photosensitive microgel. Preferred are oligomers and prepolymers. Among these, preferred are compounds having flexibility, tenacity and rubbery resilience when they are in a crosslinked and cured state. For example, preferred are urethane compounds having an $\alpha,\beta$-ethylenically unsaturated double bond, polydienes having an $\alpha,\beta$-ethylenically unsaturated double bond in terminals and branches, such as urethane acrylate and polybutadiene acrylate.

The (3) rubber or thermoplastic elastomer, which is incorporated to improve rubbery resilience, is at least one member selected from diene-, styrene-, olefin-, urethane-, vinyl-, polyamide-, fluorine- and polyester-containing materials.

The above rubber or thermoplastic elastomer can be selected from both synthetic materials and natural materials (rubbers), and they are usable in a crude rubber state or a latex state. For example, the rubber is freely selected from synthetic rubbers, crude rubbers and latex such as SBR (styrene-butadiene copolymer rubber), BR (butadiene polymer rubber), IR (isoprene polymer rubber), NBR (acrylonitrile-butadiene copolymer rubber), CR (chloroprene polymer rubber), IIR (isobutylene-diene copolymer rubber), EPM (ethylene-propylene copolymer rubber), AU (polyester isocyanate condensate), EU (polyether isocyanate condensate) and ACM (acrylate polymer rubber).

The photosensitive resin composition of the present invention contains 10 to 90 parts by weight, preferably 30 to 80 parts by weight, of the (1) photosensitive microgel, 1 to 50 parts by weight, preferably 1 to 40 parts by weight, of the (2) compound having an $\alpha,\beta$-ethylenically unsaturated double bond and 1 to 60 parts by weight, preferably 10 to 50 parts by weight, of the (3) rubber or thermoplastic elastomer.

The (2) compound having an $\alpha,\beta$-ethylenically unsaturated double bond and the (3) rubber or thermoplastic elastomer are incorporated into the photosensitive microgel by any one of the following methods.

(I) ADDITION.MIXING→DRYING

The (2) compound having an $\alpha,\beta$-ethylenically unsaturated double bond and the (3) rubber or thermoplastic elastomer are added to a dispersion of the photosensitive microgel in water, and the resultant mixture is dried. When (2) and (3) are homogeneously dispersed or dissolved in the dispersion of the photosensitive microgel in water, the dried product can be directly molded under pressure. When a good homogeneous mixture is not formed, naturally, it is necessary to fully disperse (2) and (3) after drying and before molding under pressure.

The above method is mainly employed when the (3) rubber or thermoplastic elastomer is latex, particularly cationic or nonionic latex.

Anionic latex aggregates when mixed with a dispersion of the photosensitive microgel in water, and the resultant printing plate shows a decrease in water developability. It is therefore preferred to mix dried anionic latex with a dried photosensitive microgel as shown in the following (II).

(II) DRYING→MIXING

The dispersion of the photosensitive microgel in water is dried, and then the (2) compound containing an $\alpha$, $\beta$-ethylenically unsaturated double bond and the (3) rubber or thermoplastic elastomer are added. These components were mixed (dispersed and milled) with a two-roll mill, a three-roll mill, a kneader, a plastomill or an extruder to prepare a homogeneous dispersion, and the dispersion is molded under pressure. Naturally, the dispersion.mixing step and the sheet-molding step may be carried out in series, or it is rather preferred to carry out these steps in series from the viewpoint of working steps.

(III) USE OF (I) AND (II) IN COMBINATION

The (2) compound having an $\alpha$, $\beta$-ethylenically unsaturated double bond and the (3) rubber or thermoplastic elastomer are added to a dispersion of the photosensitive microgel in water, and the mixture is dried. Further, (2) and (3) are added to the dried mixture, and these components are mixed (dispersed and milled) to prepare a homogeneous dispersion. Then, the dispersion is molded under pressure.

The photosensitive microgel or the photosensitive resin composition containing the photosensitive microgel is dried by any one of methods such as vacuum-drying, freeze-drying and spray-drying, although it shall not be specially so limited. Naturally, a conventional casting method for forming a thin film and a thick film is also included in the above drying method. Further, when (2) and (3) are aqueous ones, they may be preliminarily dried by any one of various methods in the same manner as in the method of drying the photosensitive microgel.

The photosensitive resin composition may contain an initiator, a sensitizer, a filler, other additive and a resin as required. The initiator, sensitizer, etc., may be added in the same manner as in the method of adding the above (2) and (3).

Crosslinking by radiation takes place even without any photopolymerization initiator. In irradiation with ultraviolet light, a crosslinking effect is promoted by adding a proper photopolymerization initiator. The photopolymerization initiator includes benzophenone, 2-hydroxy-2-methyl-1-phenylpropan-1-one, 1-(4-isopropylphenyl)2-hydroxy-2-methylpropan-1-one, 2-methyl-1-[4-(methylthio)phenyl]2-morpholinopropanone-1. The photopolymerization initiator is used in an amount of 0.1 to 10 parts by weight per 100 parts by weight of the photosensitive resin composition.

For improving water developability, there may be added any one of aqueous resins such as polyvinyl alcohol, carboxylmethylcellulose, methylcellulose, hydroxyethylcellulose, casein, gelatin, starch, polyvinyl pyrrolidone, poly(meth)acrylamide, xanthone and a polymer containing tertiary ammonium salt and hydrophilic monomers such as N,N-methylenebis(meth)acrylamide, 1,2-di((meth)acrylamide ethylene glycol, N,N-oxymethylenebisacrylamide, (meth)acrylamide, vinylpyrrolidone, 2-hydroxyethyl (meth)acrylate, polyoxyethylene (meth)acrylate and polyoxyethylene di(meth)acrylate. Further, for various functions, the photosensitive resin composition of the present invention may contain additives such as a colorant, an extender, a lubricant, a plasticizer, a flame retardant, an antifoamer, an antioxidant, a sterilizer, an electrically conductive material and a magnetic material.

The photosensitive resin composition containing the (1) photosensitive microgel, (2) the compound containing at least one $\alpha$, $\beta$-ethylenically unsaturated double bond in the molecule and the (3) rubber or thermoplastic elastomer, obtained as above, is formed into a film (sheet) for a virgin printing plate by means of an extruder, a pressing machine, or the like. This virgin printing plate is exposed to radioactive ray such as ultraviolet light, electron beam, or the like to crosslink and cure an exposed portion, and an unexposed portion is washed away with water to obtain a desired printing plate.

PREFERRED EMBODIMENTS FOR WORKING THE INVENTION

The present invention will be explained further in detail by reference to Examples. In Examples, the method of preparing the photosensitive microgel as one of the main components of the photosensitive resin composition is first explained, and then examples of mixing it with the second and third components are explained. Finally, there are shown evaluations of water resistance, IPA resistance, rubber hardness, tensile strength, elongation at break, etc., of sheets which were formed from photosensitive resin compositions and photo-cured. In Examples, "part" and "%" stand for "part by weight" and "% by weight".

a. Synthesis of cationic polymer emulsifier

140 Parts of lauryl methacrylate, 60 parts of 2-dimethylaminoethyl methacrylate and 200 parts of 2-propanol were heated to 80° C. under nitrogen atmosphere while they were stirred in a 2-liter reactor. 1.6 Parts of azobisisobutyronitrile (to be referred to as AIBN hereinafter) was added, and the mixture was maintained for 2 hours. Then, 0.4 part of AIBN was added and the reaction mixture was maintained at 80° C. for 4 hours to complete the polymerization. The reaction mixture was cooled to room temperature, and after a mixture of 38.2 parts of acetic acid and 1,000 parts of water was added, 2-propanol and water were azeotropically removed under heat. Then, 9.0 parts of glycidyl methacrylate was added, and the resultant mixture was heated to 70° C. under air atmosphere and maintained for 2 hours to give a cationic polymer emulsifier having a pendent methacryl group.

b. Synthesis of urethane methacrylate

100 Parts of polyesterdiol which was formed from butanediol and adipic acid and had a molecular weight of about 1,000, 75 parts of diphenylmethane diisocyanate and 0.1 part of dibutyltin dilaurate were mixed, and the resultant mixture was allowed to react at 50° C. for 30 minutes and at 90° C. for 2 hours, and the reaction mixture was cooled to 70° C. Then, 26 parts of 2-hydroxyethyl methacrylate was added, and further, the resultant mixture was allowed to react for 3 hours to give urethane dimethacrylate.

(Synthesis Example 1 on photosensitive microgel)

36 Parts of 2-ethylhexyl acrylate, 4 parts of ethylene glycol dimethacrylate, 50 parts of an aqueous solution of the reactive cationic polymer emulsifier synthesized in a (solid content 20%) and 160 parts of deionized water were heated to 80° C. under nitrogen atmosphere while they were stirred in a 500 ml reactor. 8 Parts of an aqueous solution of 3% azobisamidinopropane dihydrochloride (AAPD) was added, and after the resultant mixture was maintained for 2 hours, 2 parts of an aqueous solution of 3% AAPD was added. After the addition was finished, the reaction mixture was maintained at 80° C. for 4 hours to complete the polymerization to give a microgel water-base dispersion. The microgel was measured for a particle size by a light scattering method to show about 50 nm. The microgel water-base dispersion was allowed to stand overnight, and 2.7 parts of glycidyl methacrylate was added. The resultant mixture was heated to 70° C. under air atmosphere and maintained for 2 hours to complete the reaction.

(Synthesis Example 2 on photosensitive microgel)

40 Parts of the urethane dimethacrylate synthesized in b, 100 parts of an aqueous solution of the reactive cationic polymer emulsifier synthesized in a (solid content 20%) and 160 parts of deionized water were heated to 80° C. while they were stirred in a 500 ml reactor. 8 Parts of an aqueous solution of 3% AAPD was added, and after the resultant mixture was maintained for 2 hours, 2 parts of an aqueous solution of 3% AAPD was added. After the addition was finished, the reaction mixture was maintained at 80° C. for 4 hours to complete the polymerization, whereby a microgel water-base dispersion was obtained. The microgel was measured for a particle size by a light scattering method to show about 4 μm. The microgel water-base dispersion was allowed to stand overnight, and 2.7 parts of glycidyl methacrylate was added. The resultant mixture was heated to 70° C. under air atmosphere, and maintained for 2 hours to complete the reaction.

(Synthesis Example 3 on photosensitive microgel)

40 Parts of MAC-1000-80 (acrylation product of polybutadiene supplied by Nippon Oil Co., Ltd. ), 100 parts of an aqueous solution of the reactive cationic polymer emulsifier synthesized in a (solid content 20%), 2.5 parts of Emalgen 420 (polyoxyethylene oleyl ether supplied by Kao Corp.) and 160 parts of ion-exchanged water were heated to 80° C. under nitrogen atmosphere while they were stirred in a 500 ml reactor. 8 Parts of an aqueous solution of 3% AAPD was added, and after the resultant mixture was maintained for 2 hours, 2 parts of an aqueous solution of 3% AAPD was added. After the addition was finished, the reaction mixture was maintained at 80° C. for 4 hours to complete the polymerization, whereby a dispersion of microgel in water was obtained. The microgel was measured for a particle size by a light scattering method to show about 5 μm. The dispersion of the microgel in water was allowed to stand overnight, and then 2.1 parts of glycidyl methacrylate was added. The resultant mixture was heated to 70° C. under air atmosphere and maintained for 2 hours to complete the reaction.

(Synthesis Example 4 on photosensitive microgel)

50 Parts of R-45ACR-LC (diacrylation product of polybutadiene, supplied by Idemitsu Petrochemical Co., Ltd.), 25 parts of an aqueous solution of the reactive cationic polymer emulsifier synthesized in a (solid content 20%), 2 parts of Emalgen 810 (polyoxyethylene octylphenyl ether, supplied by Kao Corp.) and 160 parts of ion-exchanged water were heated to 80° C. under nitrogen atmsophere while they were stirred in a 500 ml reactor. 8 Parts of an aqueous solution of 3% AAPD was added and maintained for 2 hours. Then, 2 parts of an aqueous solution of 3% AAPD was added. After the addition was finished, the reaction mixture was maintained at 80° C. for 4 hours to complete the polymerization, whereby a dispersion of microgel in water was obtained. The microgel was measured for a particle size by a light scattering method to show about 5 μm. The dispersion of the microgel in water was allowed to stand overnight, and 2.1 parts of glycidyl methacrylate was added. The resultant mixture was heated to 70° C. under air atmosphere, and allowed to stand for 2 hours to complete the reaction.

(Examples 1, 2, 3 and 4 )

Water was distilled off from 200 parts of each of the dispersions of microgels in water (solid content 25%), obtained in Synthesis Examples 1, 2, 3 and 4, with an evaporator until they were free of flowability. Then, the dispersions were placed in vats, and further dried in a vacuum dryer to give four kinds of powders. It took about 3 hours to obtain the powders from the dispersions by the above procedures.

1.5 Parts of the urethane dimethacrylate synthesized in b, 1.5 parts of polybutadiene rubber (trade name: JSR BRO2L, supplied by Japan Synthetic Rubber Co., Ltd.) and 0.5 part of Darocure 2959 (supplied by Merck Co.) were added to 7 parts of each of the above-obtained powders, and dispersed therein with a two-roll mill (Examples 1 and 4).

In Examples 2 and 3, BROL2 was replaced with a styrene.isoprene.styrene block copolymer (trade name: Craton DI320X, supplied by Shell Chemical Co., Example 2) and with polybutadiene rubber (trade name: JSR SL599, supplied by Japan Synthetic Rubber Co., Ltd., Example 3).

(Examples 5 and 6)

1.5 Parts of MAC-1000-80 (acrylation product of polybutadiene, supplied by Nippon Oil Co., Ltd.), 1.5 parts of polybutadiene rubber (trade name: JSR BRO2L, supplied by Japan Synthetic Rubber Co., Ltd.) and 0.5 part of Darocure 2959 (supplied by Merck Co.) were added to 7 parts of each of the two powders obtained in Examples 1 and 2, and dispersed therein with a two-roll mill.

(Example 7)

1.5 Parts an acrylation product of polybutadiene (trade name: MAC-1000-80, supplied by Nippon Oil Co., Ltd.), 1.5 parts of a styrene.isoprene.styrene block copolymer (trade name: Craton D132OX supplied by Shell Chemical Co.) and 0.5 part of Darocure 2959 (supplied by Merck Co.) were added to 7 parts of the powder obtained in Example 3, and dispersed therein with a two-roll mill.

(Example 8)

1.5 Parts a diacrylation product of polybutadiene (trade name: R-45ACR-LC, supplied by Idemitsu Petrochemical Ltd.), 1.5 parts of styrene.butadiene rubber (trade name: JSR SL599, supplied by Japan Synthetic Rubber Co., Ltd. ) and 0.5 part of Darocure 2959 (supplied by Merck Co.) were added to 7 parts of the powder obtained in Example 4, and dispersed therein with a two-roll mill.

(Comparative Examples 1, 2, 3 and 4)

2.5 Parts of Darocure 2959 (supplied by Merck Co.) was added to 200 parts of each of the dispersions of microgels in water (solid content 25%), obtained in Synthetic Examples 1, 2, 3 and 4, and water was distilled off with an evaporator until they were free of flowability. Then, the dispersions were placed in vats, and further dried in a vacuum dryer to give foul kinds of powders. It took about 3 hours to obtain the powders from the dispersions by the above procedures.

(Comparative Examples 5 and 6)

3 Parts of the urethane dimethacrylate synthesized in b and 0.5 part of Darocure 2959 (supplied by Merck Co.) were added to each of two kinds of the powders obtained in Examples 1 and 2, and dispersed therein with a two-roll mill.

(Comparative Examples 7 and 8)

3 Parts of an acrylation product of polybutadiene (trade name: MAC-1000-80, supplied by Nippon Oil Co., Ltd., Comparative Example 7) and 0.5 part of Darocure 2959 (supplied by Merck Co.) were added to 7 parts of each of two kinds of the powders obtained in Examples 3 and 4, and dispersed therein with a two-roll mill. In Comparative Example 8, the acrylation product of polybutadiene was replaced with 1.5 parts of a diacrylation product of polybutadiene (trade name: R-45ARC-LC, supplied by Idemitsu Petrochemical Co., Ltd.), and the above procedures were repeated in the same manner as in Comparative Example 7.

(Comparative Examples 9 and 10)

3 Parts of polybutadiene rubber (trade name: JSR BRO2L, supplied by Japan Synthetic Rubber Co., Ltd.) and 0.5 part of Darocure 2959 (supplied by Merck Co.) were added to 7 parts of each of two kinds of the powders obtained in Examples 1 and 2, and dispersed therein with a two-roll mill.

(Comparative Examples 11 and 12)

3 Parts of styrenebutadiene rubber (trade name: JSR SL599, supplied by Japan Synthetic Rubber Co., Ltd.) and 0.5 part of Darocure 2959 (supplied by Merck Co.) were added to 7 parts of each of two kinds of the powders obtained in Examples 3 and 4, and dispersed therein with a two-roll mill.

(Film formation)

About 10 parts of each of the photosensitive resin compositions obtained in Examples 1 to 8 and the powders obtained in Comparative Examples 1 to 12 was independently pressed with a pressing machine to form uniform films having a thickness of about 3 mm under the pressing conditions of 50° C., 100 kg/cm$^2$ and 15 minutes.

(Evaluation on physical properties)

The above-formed films were exposed to ultraviolet light at 4,000 mJ/cm$^2$ to convert them to cured films. These cured films were measured for tensile strength, elongation at break, rubber hardness, water resistance, alkali resistance and IPA resistance at room temperature (25° C). On the evaluation of the water resistance, alkali resistance and IPA resistance, the films were immersed in ion-exchanged water, sodium carbonate aqueous solution (pH=9) and isopropyl alcohol (IPA) for 24 hours and then measured for their weight increase ratios. Table 1 shows the results.

Breaking strength: Measured with a tensile tester.
Elongation at break Sample size: 10×20×3 (mm)
Test conditions: Pulling rate 50 mm/min.
Rubber hardness: Measured according to JIS-K6301.
Weight increase ratio: ((weight after immersion for 24 hours/weight before the immersion)−1)×100
Resolution: A mask film having a pattern of a variety of line widths was placed on the film, and the film was exposed to ultraviolet light and developed with water. The narrowest line width that was obtained by the development with water was regarded as a resolution.

TABLE 1

| | Photosensitive microgel | (1)/(2)/(3) | Rubber hardness | Tensile strength | Elongation at break (%) | Weight increase ratio (%) | | | Resolution (μm) |
|---|---|---|---|---|---|---|---|---|---|
| | | | | | | Water | Na$_2$CO$_3$ | IPA | |
| Example | | | | | | | | | |
| 1 | Synthesis Example 1 | 7/1.5/1/5 | 35 | 30 | 325 | 4 | 5 | 11 | 50 |
| 2 | Synthesis Example 2 | 7/1.5/1/5 | 38 | 32 | 280 | 4 | 4 | 11 | 50 |
| 3 | Synthesis Example 3 | 7/1.5/1/5 | 36 | 40 | 320 | 3 | 4 | 11 | 50 |
| 4 | Synthesis Example 4 | 7/1.5/1/5 | 35 | 34 | 330 | 4 | 5 | 12 | 50 |
| 5 | Synthesis Example 1 | 7/1.5/1/5 | 35 | 32 | 330 | 4 | 5 | 12 | 50 |
| 6 | Synthesis Example 2 | 7/1.5/1/5 | 37 | 35 | 310 | 4 | 5 | 12 | 50 |
| 7 | Synthesis Example 3 | 7/1.5/1/5 | 36 | 38 | 350 | 4 | 5 | 12 | 50 |
| 8 | Synthesis Example 4 | 7/1.5/1/5 | 36 | 38 | 350 | 4 | 5 | 12 | 50 |
| Comparative Example | | | | | | | | | |
| 1 | Synthesis Example 1 | 10/0/0 | 45 | 11 | 250 | 7 | 6 | 15 | 50 |
| 2 | Synthesis Example 2 | 10/0/0 | 55 | 17 | 100 | 6 | 6 | 13 | 50 |
| 3 | Synthesis Example 3 | 10/0/0 | 60 | 16 | 110 | 6 | 6 | 13 | 50 |
| 4 | Synthesis Example 4 | 10/0/0 | 57 | 20 | 150 | 6 | 6 | 13 | 50 |
| 5 | Synthesis Example 1 | 7/3/0 | 40 | 25 | 280 | 4 | 6 | 13 | 50 |
| 6 | Synthesis Example 2 | 7/3/0 | 43 | 29 | 269 | 3 | 5 | 13 | 50 |
| 7 | Synthesis Example 3 | 7/3/0 | 55 | 21 | 270 | 4 | 5 | 12 | 50 |
| 8 | Synthesis Example 4 | 7/3/0 | 53 | 21 | 272 | 4 | 5 | 12 | 50 |

TABLE 1-continued

| | Photosensitive microgel | (1)/(2)/(3) | Rubber hardness | Tensile strength | Elongation at break (%) | Weight increase ratio (%) | | | Resolution (μm) |
|---|---|---|---|---|---|---|---|---|---|
| | | | | | | Water | $Na_2CO_3$ | IPA | |
| 9 | Synthesis Example 1 | 7/3/0 | 40 | 23 | 300 | 6 | 6 | 13 | 50 |
| 10 | Synthesis Example 2 | 7/3/0 | 40 | 27 | 285 | 6 | 6 | 14 | 50 |
| 11 | Synthesis Example 3 | 7/3/0 | 50 | 25 | 269 | 6 | 6 | 13 | 50 |
| 12 | Synthesis Example 4 | 7/3/0 | 47 | 28 | 307 | 6 | 6 | 13 | 50 |

Notes:
(1) stands for a photosensitive microgel,
(2) stands for a compound having α, β-ethylenically unsaturated double bond, i.e., second component,
(3) stands for rubber or thermoplastic elastomer, i.e., third component, and the unit of the tensile strength is kg/cm².

Industrial Utilization

Due to the photosensitive resin composition of the present invention, there can be produced an excellent flexographic printing plate which shows remarkably improved tensile strength, elongation at break, rubber hardness, and the like and which can be developed with water.

What is claimed is:

1. A photosensitive resin composition comprising (1) a dry photosensitive microgel obtained by emulsion-polymerizing (a) a compound having an α, β-ethylenically unsaturated double bond in the presence, as an emulsifier, of (b) a compound containing a tertiary ammonium salt to prepare (A) fine microgel particles and reacting the (A) fine microgel particles with (B) a compound having an epoxy group to react with the tertiary ammonium salt and at least one α, β-ethylenically unsaturated double bond per molecule, (2) a compound having an α, β-ethylenically unsaturated double bond, and (3) a rubber or thermoplastic elastomer.

2. A photosensitive resin composition according to claim 1, wherein the (a) compound having an α, β-ethylenically unsaturated double bond is at least one compound selected from the group consisting of urethane compounds having an α, β-ethylenically unsaturated double bond, polydienes having an α, β-ethylenically unsaturated double bond in their terminals or branches, and mixtures of said urethane compounds and/or said polydienes with a compound having an α, β-ethylenically unsaturated double bond other than said urethane compounds.

3. A photosensitive resin composition according to claim 1, wherein the (b) compound containing a tertiary ammonium salt has an α, β-ethylenically unsaturated double bond.

4. A photosensitive resin composition according to claim 1, wherein the fine microgel particles (A) are produced by emulsion-polymerization in comination with a low-molecular-weight surfactant.

5. A photosensitive resin composition according to claim 4, wherein the low-molecular-weight surfactant is a nonionic surfactant or a cationic surfactant.

6. A photosensitive resin composition according to claim 1, wherein the (2) compound having an α, β-ethylenically unsaturated double bond is at least one compound selected from the group consisting of urethane compounds having an α, β-ethylenically unsaturated double bond, polydienes having an α, β-ethylenically unsaturated double bond in their terminals or branches, and mixtures of said urethane compounds and/or said polydienes with a compound having an α, β-ethylenically unsaturated double bond other than said urethane compounds.

7. A photosensitive resin composition according to claim 1, wherein the (3) rubber or thermoplastic elastomer is at least one member selected from the group consisting of diene-, styrene-, olefin-, urethane-, vinyl-, polyamide-, fluorine- and polyester-containing materials.

8. A photosensitive resin composition according to claim 1, wherein the (3) rubber is at least one memeber selected from the group consisting of styrene-butadiene copolymer rubber, butadiene polymer rubber, isoprene polymer rubber, acrylonitrile-butadiene copolymer rubber, chloroprene polymer rubber, isobutylene-diene copolymer rubber, ethylene-propylene copolymer rubber, polyester isocyanate condensate, polyether isocyanate condensate and acrylate polymer rubber.

9. A process for the production of the photosensitive resin composition recited in claim 1, which comprises drying a dispersion of (1) a photosensitive microgel in water, and mixing the resultant dried dispersion with (2) a compound having an α, β-ethylenically unsaturated double bond and (3) rubber or thermoplastic elastomer.

10. A virgin flexographic printing plate material containing the photosensitive resin composition recited in claim 1.

* * * * *

UNITED STATES PATENT AND TRADEMARK OFFICE
CERTIFICATE OF CORRECTION

PATENT NO. : 5,362,604
DATED : November 8, 1994
INVENTOR(S) : Yoshimi YATSUYANAGI It is certified that error appears in the above-indentified patent and that said Letters Patent is hereby corrected as shown below:

In Claim 4 at

Column 13, line 53, change "comination" to
--combination--;

In Claim 8 at

Column 14, line 38, change "memeber" to
--member--.

Signed and Sealed this

Ninth Day of May, 1995

Attest:

BRUCE LEHMAN

Attesting Officer     Commissioner of Patents and Trademarks